(12) United States Patent  
Nishikawa et al.

(10) Patent No.: US 8,866,021 B2
(45) Date of Patent: Oct. 21, 2014

(54) CIRCUIT BOARD AND PROCESS FOR PRODUCING THE SAME

(75) Inventors: Hidenobu Nishikawa, Nara (JP); Daido Komyoji, Nara (JP)

(73) Assignee: Panasonic Corporation, Osaka (JP)

( * ) Notice: Subject to any disclaimer, the term of this patent is extended or adjusted under 35 U.S.C. 154(b) by 64 days.

(21) Appl. No.: 13/614,630

(22) Filed: Sep. 13, 2012

(65) Prior Publication Data

US 2013/0010436 A1 Jan. 10, 2013

Related U.S. Application Data

(62) Division of application No. 12/161,907, filed as application No. PCT/JP2007/051542 on Jan. 31, 2007, now Pat. No. 8,291,582.

(30) Foreign Application Priority Data

Feb. 13, 2006 (JP) .................................. 2006-034813

(51) Int. Cl.
*H05K 1/00* (2006.01)

(52) U.S. Cl.
USPC ........................................................ 174/254

(58) Field of Classification Search
CPC ..................................................... H05K 3/323
USPC .................................. 174/254; 361/749–751
See application file for complete search history.

(56) References Cited

U.S. PATENT DOCUMENTS

| 3,795,047 | A | * | 3/1974 | Abolafia et al. ................ 29/843 |
| 5,566,441 | A | | 10/1996 | Marsh et al. |
| 5,671,525 | A | | 9/1997 | Fidalgo |
| 6,420,213 | B1 | | 7/2002 | Nakajyo et al. |
| 6,981,317 | B1 | | 1/2006 | Nishida |
| 7,902,678 | B2 | | 3/2011 | Ohuchi et al. |
| 2005/0093172 | A1 | | 5/2005 | Tsukahara et al. |
| 2006/0152960 | A1 | * | 7/2006 | Sheats ............................ 365/112 |

FOREIGN PATENT DOCUMENTS

| JP | 63-275127 A | 11/1988 |
| JP | 07-50726 A | 5/1995 |
| JP | 11-175682 A | 7/1999 |
| JP | 2001-068815 A | 3/2001 |
| JP | 2005-111928 A | 4/2005 |
| JP | 2005-117074 A | 4/2005 |
| JP | 2005-129757 A | 5/2005 |
| WO | WO-98/30073 A1 | 7/1998 |

OTHER PUBLICATIONS

Japanese Office Action issued in Japanese Patent Application No. JP 2008-500433 dated Dec. 21, 2010.

* cited by examiner

*Primary Examiner* — Jeremy C Norris

(74) *Attorney, Agent, or Firm* — McDermott Will & Emery LLP

(57) ABSTRACT

The invention includes: applying an anisotropic conductive resin including conductive particles only to a plurality of bumps of an electronic component; placing the electronic component above a main surface of a flexible wiring board via the anisotropic conductive resin; and pressurizing the electronic component to the wiring board and curing the anisotropic conductive resin applied to the plurality of bumps to join the plurality of bumps to the electrodes of the wiring board. This can prevent a defective mounting of the electronic component.

7 Claims, 3 Drawing Sheets

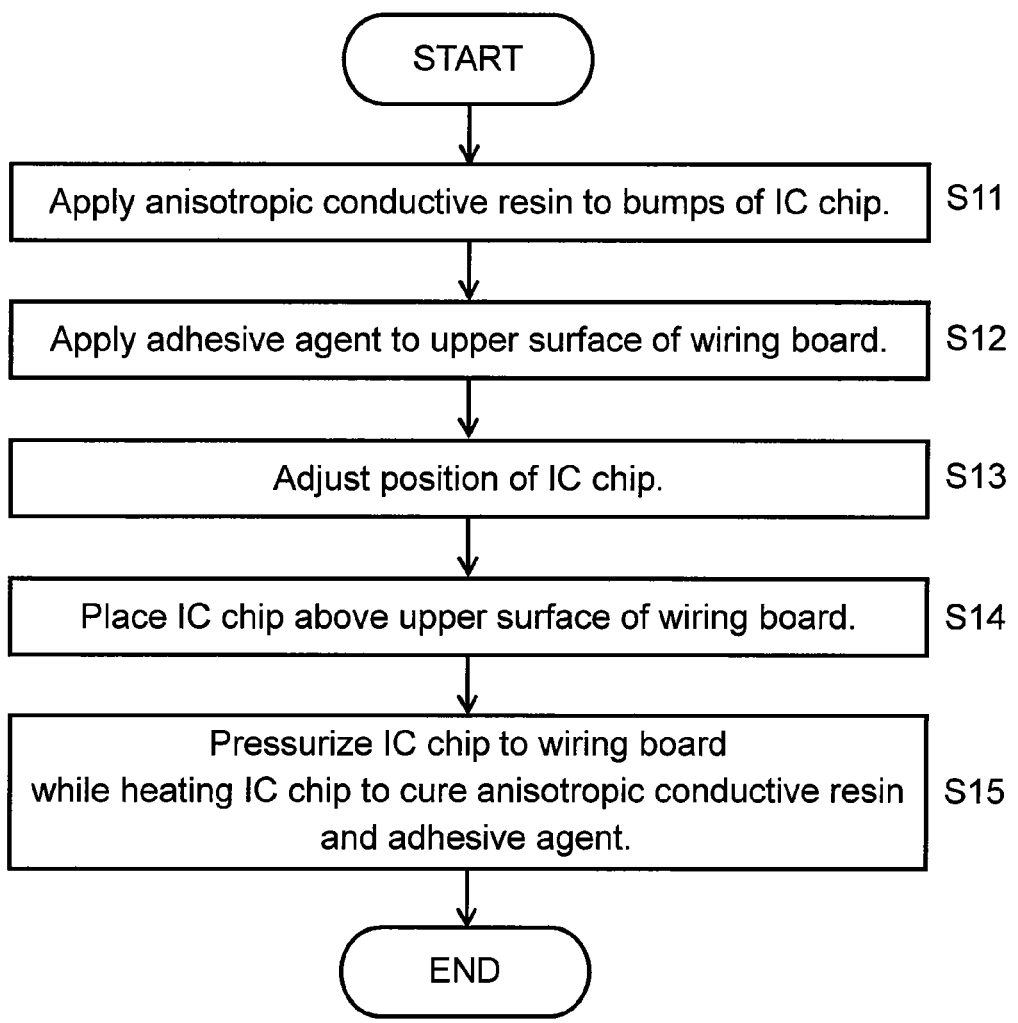

CIRCUIT BOARD AND PROCESS FOR PRODUCING THE SAME

RELATED APPLICATIONS

This application is a Divisional Application of U.S. application Ser. No. 12/161,907, filed on Jul. 23, 2008, now U.S. Pat. No. 8,291,582, which is the U.S. National Phase under 35 U.S.C. §371 of International Application No. PCT/JP2007/051542, filed on Jan. 31, 2007, which in turn claims the benefit of Japanese Application No. 2006-034813, filed on Feb. 13, 2006, the disclosures of which applications are incorporated by reference herein.

TECHNICAL FIELD

The present invention relates to a circuit board in which an electronic component is mounted to a flexible wiring board and a method for producing the circuit board.

BACKGROUND ART

Conventionally, one method has been known to mount an electronic component on a wiring board to produce a circuit board. According to this method, a bump is provided on an electrode of an electronic component to join the bump with the electrode on the wiring board. For example, a method has been suggested to transfer electrically-conductive adhesive agent onto electric connection contact points (bumps) of a semiconductor chip by the stamping method for example to heat the conductive adhesive agent while pressing the semiconductor chip to a circuit board (e.g., see Patent Publication 1).

On the other hand, an Integrated Circuit Card (IC card) has been widely used in recent years as a card-type recording medium substituting a magnetic card. A method for mounting a bare chip on an IC card board has been suggested according to which a bare chip having a gold bump is flip-chip-mounted via silver paste or an anisotropic conductive film (e.g., see Patent Publication 2). A technique also has been known that a tip end of a protruded electrode (bump) of an electronic component is caused to bite into an electrode of an IC card board for mounting to use thermoplastic resin to seal the electronic component on the board (e.g., see Patent Publication 3).

In the case of Patent Publication 1 however, the smaller size the mounted electronic component has, the shorter distance between bumps is caused. Due to this reason, when the electronic component is mounted via conductive adhesive agent having a high filler content rate (e.g., silver paste), the conductive adhesive agent is expanded between the bumps, which may cause a defective mounting between the electrodes (e.g., short circuiting). Also due to this reason, when the electronic component is mounted via nonconductive resin paste for example, limitation is caused on the reliability of the electric connection between the bump and the electrode.

The IC cards disclosed in Patent Publications 2 and 3 generally use a wiring board made of polyethylene terephthalate (PET) for the purpose of realizing a thinner thickness and reduced cost. However, since the PET-made wiring board is highly-flexible, the electronic component mounted above the wiring board causes the deflection and deformation of a part of the wiring board in the vicinity of a region at which a bump is pressed. Thus, the lower surface of the electronic component is close to the upper surface of the wiring board at positions in the vicinity of the edges of the electronic component and a position near the center between the bumps.

When the electronic component is electrically-connected to the wiring board via anisotropic conductive resin for example in this case, conductive particles included in the anisotropic conductive resin are sandwiched between the electronic component and the wiring board at a part at which the electronic component is close to the wiring board. This consequently leads to electrical connection between the electronic component and the wiring board, resulting in a disadvantageous defective mounting of the electronic component for example.

[Patent Publication 1] Japanese translation of PCT publication H7.50726
[Patent Publication 2] Japanese Patent Unexamined Publication No. H11-175682
[Patent Publication 3] Japanese Patent Unexamined Publication No. 2005-111928

SUMMARY OF THE INVENTION

A method for producing a circuit board of the present invention includes: a step a) of applying anisotropic conductive resin including conductive particles only to a plurality of bumps of an electronic component; a step b) of placing the electronic component above a main surface of a flexible wiring board via the anisotropic conductive resin; and a step c) of pressurizing the electronic component to the wiring board and curing the anisotropic conductive resin applied to the plurality of bumps to join the plurality of bumps to a wiring of the wiring board.

Since this method applies the anisotropic conductive resin only to the plurality of bumps, this method can produce a circuit board for which a defective mounting of the electronic component is prevented.

The circuit board of the present invention includes: a flexible wiring board; an electronic component mounted on a main surface of the wiring board via a plurality of bumps; first resin layers made of anisotropic conductive resin including conductive particles individually covering the plurality of bumps; and a second resin layer that fixes the electronic component and the wiring board.

This configuration can stably fix the electronic component to the wiring board, thus realizing a circuit board that can be reliably connected.

BRIEF DESCRIPTION OF THE DRAWINGS

FIG. 3 is a flowchart illustrating the flow of the production of the circuit board according to the exemplary embodiment of the present invention.

REFERENCE MARKS IN THE DRAWINGS

Figure 1:
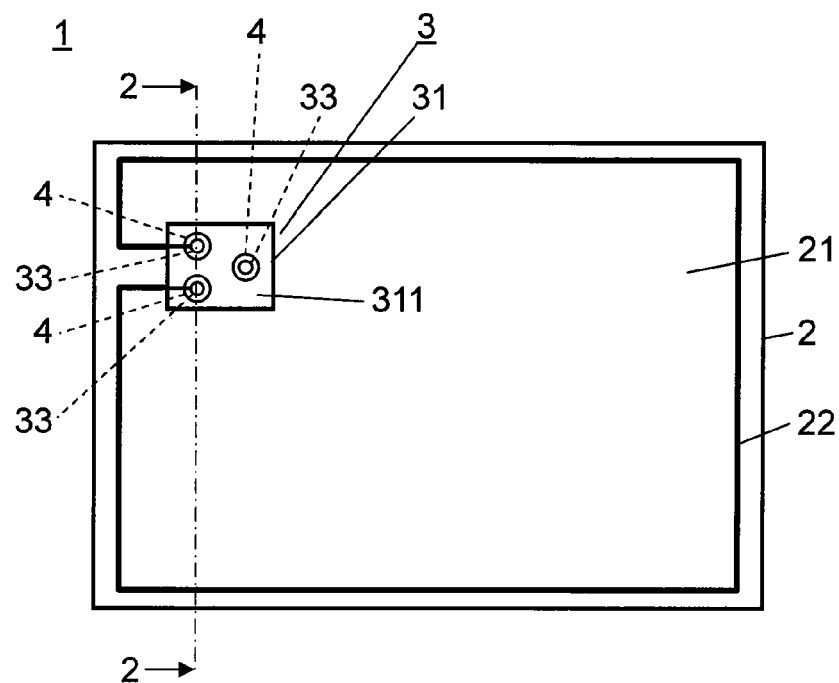
FIG. 1 is a top view illustrating the configuration of a circuit board according to an exemplary embodiment of the present invention.

1 Circuit board
2 Wiring board
3 IC chip (electronic component)
4 First resin layer
4a, 40 Anisotropic conductive resin
5 Second resin layer
5a Adhesive agent
21 Upper surface
22 Antenna
23 and 32 Electrode
31 Chip body
33 Bump
42 Member
91 Chip retainer
92 Pressurizing tool
311 Lower surface
331 Protruded section

DETAILED DESCRIPTION OF PREFERRED EMBODIMENTS

Figure 2:
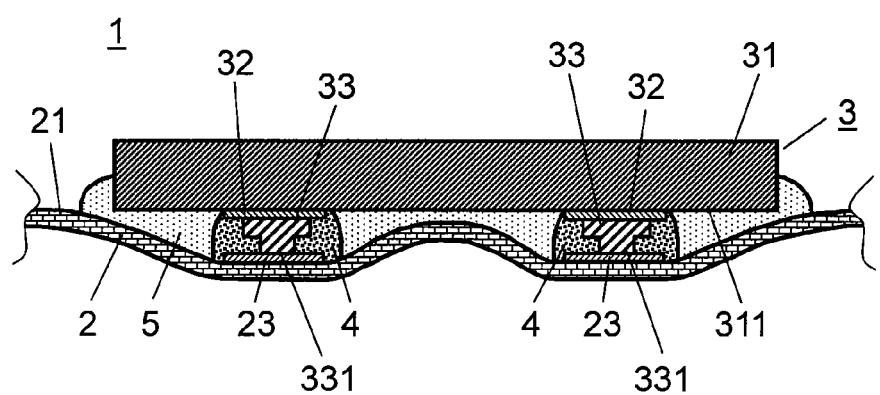
FIG. 2 is a cross-sectional view illustrating a part of the circuit board according to the exemplary embodiment of the present invention taken along the line 2-2 of FIG. 1.

FIG. 1 is a top view illustrating the configuration of a circuit board according to an exemplary embodiment of the present invention. FIG. 2 is a cross-sectional view illustrating a part of the circuit board according to the exemplary embodiment of the present invention taken along the line 2-2 of FIG. 1.

As shown in FIG. 1 and FIG. 2, circuit board 1 is an inlet for an Integrated Circuit Card (IC card) for example. Circuit board 1 includes: flexible wiring board 2 made of PET for example; electronic component 3 such as an IC chip (hereinafter referred to as "IC chip") mounted on one main surface 21 of wiring board 2 (which is the upper main surface in FIG. 2 and hereinafter referred to as "upper surface" hereinafter); and antenna 22 that sends and receives information or electric power. As shown in FIG. 2, wiring board 2 is generally mounted in such a manner that wiring board 2 is bent in the vicinity of parts at which wiring board 2 is joined to IC chip 3. It is noted that the deflection of wiring board 2 shown in FIG. 2 is exaggerated. IC chip 3 shown in FIG. 1 and FIG. 2 is a storage element for storing predetermined information (e.g., product history, control data) and is a Large Scale Integration (LSI) including a Ferroelectric Random Access Memory (FeRAM) for example.

Chip body 31 of IC chip 3 has a substantially-rectangular shape when seen from the top. A surface of chip body 31 opposed to wiring board 2 (hereinafter referred to as "lower surface 311") has electrodes 32 on which bumps 33 are provided. IC chip 3 is mounted on upper surface 21 of wiring board 2 via bumps 33. As shown in FIG. 2, bump 33 is a stud-like ball bump (so-called stud bump) that has protruded section 331 at the tip end thereof for example.

As shown in FIG. 1, antenna 22 for wireless communication is formed to have a coil-like shape along the outer periphery of wiring board 2. Antenna 22 is electrically connected to IC chip 3 via two electrodes 23 that are formed on upper surface 21 of wiring board 2 and that constitute a part of the wiring configuring antenna 22. Antenna 22 reads the information stored in IC chip 3. Two bumps 33 positioned at the left side of circuit board 1 in FIG. 1 are electrically connected to two electrodes 23 on wiring board 2, respectively. Bump 33 positioned at the right side of FIG. 1 is a dummy bump for realizing the stable mounting of IC chip 3 for example and is not electrically connected to wiring board 2 in this case.

As shown in FIG. 1 and FIG. 2, circuit board 1 includes first resin layers 4 that are provided at the inner sides of the edges of chip body 31 of IC chip 3 and that individually cover bumps 33. First resin layer 4 is made of anisotropic conductive resin including minute conductive particles for example.

As shown in FIG. 1, circuit board 1 includes second resin layer 5 that is provided at least between upper surface 21 of wiring board 2 and lower surface 311 of IC chip 3 to cover first resin layers 4 and that adheres IC chip 3 to wiring board 2. Second resin layer 5 is made of adhesive agent that is nonconductive resin for example. For easy understanding, FIG. 1 does not show second resin layer 5.

Wiring board 2 preferably has a thickness of 5 μm or more and 50 μm or less. In this exemplary embodiment, wiring board 2 has a thickness of about 12.5 μm. IC chip 3 has a thickness of about 50 μm for example. Bumps 33 have a height of about 25 μm. Wiring board 2 having a thickness smaller than 5 μm is difficult to be handled and wiring board 2 having a thickness exceeding 50 μm makes it difficult to realize a circuit board that is thinner and that is flexible.

The following section will describe a method for producing circuit board 1 according to the exemplary embodiment of the present invention with reference to FIG. 3. FIG. 3 is a flow-chart illustrating the flow of the method for producing the circuit board according to the exemplary embodiment of the present invention. FIG. 4A to FIG. 4D are a partial cross-sectional view illustrating the method for producing circuit board 1. It is noted that FIG. 4A to FIG. 4D are a partial cross-sectional view taken along line 2-2 in FIG. 1.

Figure 4A:
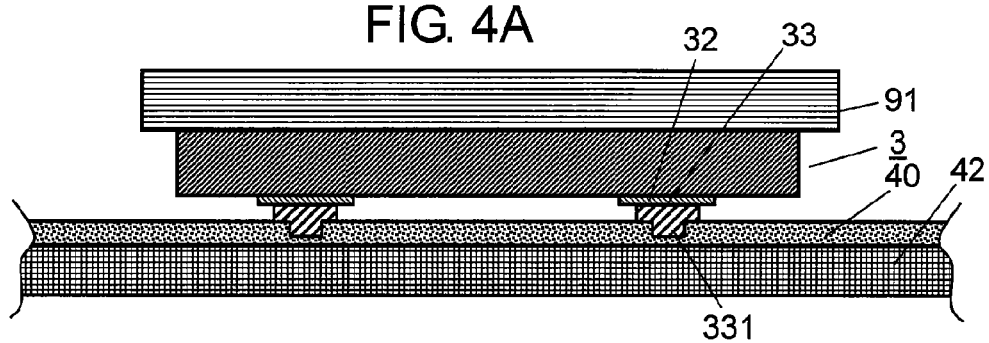
FIG. 4A is a partial cross-sectional view illustrating a method for producing the circuit board according to the exemplary embodiment of the present invention.

First, as shown in FIG. 4A, chip retainer 91 of a mounting apparatus (not shown) is used to retain IC chip 3 to abut at least protruded sections 331 at the tip ends of bumps 33 of IC chip 3 against layer-like anisotropic conductive resin 40 formed on member 42 having a predetermined smooth surface. Thereafter, IC chip 3 is lifted to separate bumps 33 from layer-like anisotropic conductive resin 40. As a result, as shown in FIG. 4B, anisotropic conductive resin 4a including minute conductive particles are applied (or transferred) to at least protruded sections 331 at the tip ends of bumps 33 (Step S11).

Figure 4B:
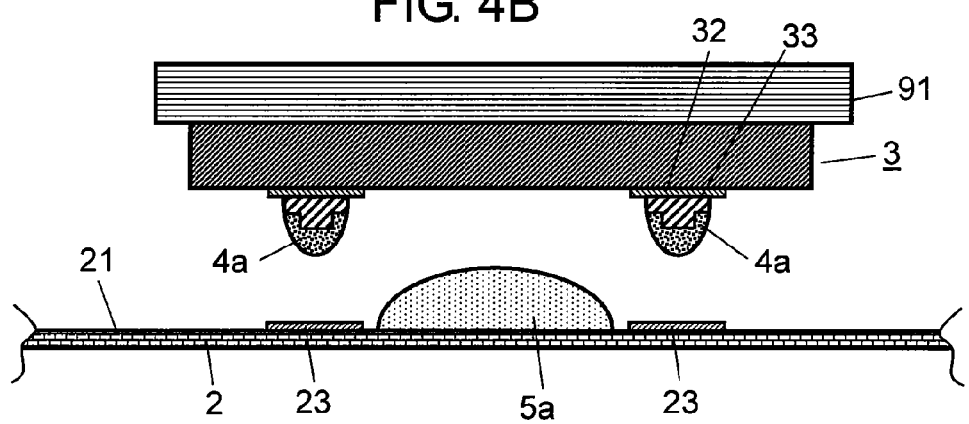
FIG. 4B is a partial cross-sectional view illustrating the method for producing the circuit board according to the exemplary embodiment of the present invention.

Next, as shown in FIG. 4B, adhesive agent 5a such as nonconductive resin paste is applied to a region other than regions to be joined with bumps 33 (electrodes 23) among a region on upper surface 21 of wiring board 2 on which IC chip 3 is to be mounted (a region at least opposed to the lower surface of IC chip 3) (Step S12). Thereafter, chip retainer 91 is moved relative to the upper side of wiring board 2 to adjust the position of IC chip 3 to wiring board 2 (Step S13). As a result, two bumps 33 other than the dummy bump are opposed to two electrodes 23 constituting a part of wiring board 2, respectively.

Figure 4C:
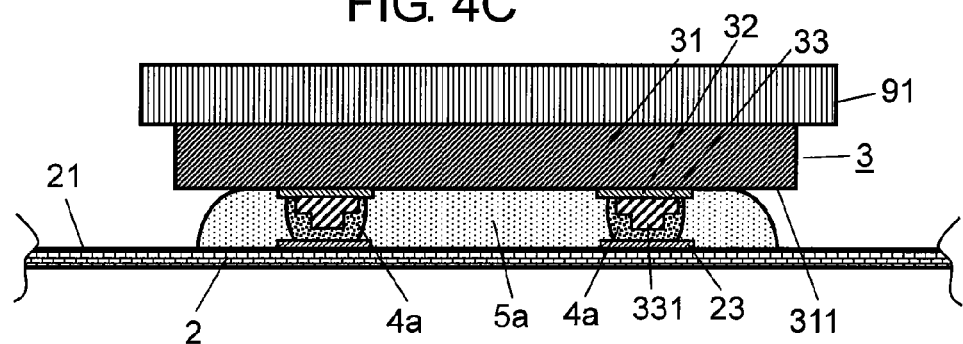
FIG. 4C is a partial cross-sectional view illustrating the method for producing the circuit board according to the exemplary embodiment of the present invention.

Next, as shown in FIG. 4C, IC chip 3 and chip retainer 91 are lowered together to place IC chip 3 above upper surface 21 of wiring board 2 via anisotropic conductive resin 4a applied to protruded sections 331 at the tip ends of bumps 33. At the same time, adhesive agent 5a is caused by the own weight of chip body 31 to be expanded over lower surface 311 of chip body 31 to the periphery and is filled between IC chip 3 and wiring board 2 (Step S14).

Figure 4D:
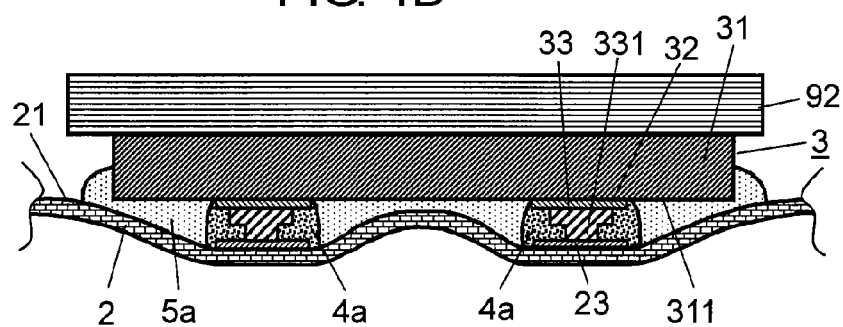
FIG. 4D is a partial cross-sectional view illustrating the method for producing the circuit board according to the exemplary embodiment of the present invention.

Next, as shown in FIG. 4D, the retention of IC chip 3 by chip retainer 91 is cancelled to press IC chip 3 toward upper surface 21 of wiring board 2 via pressurizing tool 92. Consequently, at least protruded sections 331 of bumps 33 of IC chip 3 are abutted against electrodes 23 of wiring board 2 to establish the connection therebetween. At the same time, wiring board 2 is bent by the pressing force of IC chip 3 and parts of wiring board 2 in the vicinity of bumps 33 are deformed to the lower side for example and surrounding parts slightly away from bumps 33 of circuit board 2 are deformed to the upper side for example and are close to lower surface 311 of IC chip 3. Wiring board 2 is particularly close to IC chip 3 at positions in the vicinity of the edges of chip body 31 of IC chip 3 and at a position near the center between bumps 33 (a position near the center of a straight line connecting two neighboring bumps 33).

Anisotropic conductive resin 4*a* on wiring board 2 is expanded by the pressurization of IC chip 3 to the peripheries of bumps 33 and adhesive agent 5*a* is also further expanded. It is noted that anisotropic conductive resin 4*a* applied in Step S11 to protruded sections 331 at the tip ends of bumps 33 is in a small amount and thus anisotropic conductive resin 4*a* expanded by bumps 33 is prevented from being expanded over the edges of chip body 31 of IC chip 3 and thus remains in the vicinity of bumps 33 between chip body 31 and wiring board 2. As a result, bumps 33 are connected to electrodes 23 in abutment thereto to crush the conductive particles in anisotropic conductive resin 4*a* to secure the electrical connection therebetween.

Simultaneously with the pressurization of IC chip 3 to wiring board 2, a heater (not shown) provided in pressurizing tool 92 is used to heat IC chip 3 via pressurizing tool 92 while IC chip 3 being pressurized to wiring board 2. Then, anisotropic conductive resin 4*a* applied to bumps 33 of IC chip 3 thermally-cures. As a result, as shown in FIG. 2, first resin layers 4 individually covering bumps 33 are formed at the inner sides of the edges of IC chip 3.

In this manner, the pressurization and heating of IC chip 3 establish the electrical connection between IC chip 3 and electrodes 23 of antenna 22 of wiring board 2 (see FIG. 1) via bumps 33 and also allow IC chip 3 to be joined and mounted to wiring board 2. At the same time, adhesive agent 5*a* thermally-cures to form second resin layer 5 that seals the space between IC chip 3 and wiring board 2 to stably fix IC chip 3 to wiring board 2 (Step S15). Through the above process, IC chip 3 is mounted on wiring board 2 to produce circuit board 1.

Thereafter, the main surfaces at both sides of circuit board 1 are covered by a cover sheet made of polycarbonate for example, thereby producing an IC card. The resultant IC card has a thickness of about 0.76 mm for example.

As described above, according to circuit board 1 of this exemplary embodiment, only a small amount of anisotropic conductive resin 4*a* is applied to at least protruded sections 331 at the tip ends of bumps 33 of IC chip 3. This can prevent, when IC chip 3 is mounted, conductive particles included in anisotropic conductive resin 4*a* from being expanded to the outer sides of the edges of chip body 31 of IC chip 3 or the neighborhood of the center between bumps 33. In other words, conductive particles can be enabled to exist only in the vicinity of a part at which bumps 33 are joined to wiring board 2 and the neighborhood of this joint part. Furthermore, according to circuit board 1 of this exemplary embodiment, conductive particles can be prevented from reaching a part at which a short distance is caused between upper surface 21 of wiring board 2 and lower surface 311 of IC chip 3. This can consequently prevent this part from having the continuity between wiring board 2 and chip body 31 or the continuity between bumps 33, thereby preventing a defective mounting of IC chip 3 (e.g., short circuiting) to realize circuit board 1 that can be reliably connected for example.

Also according to the method for producing circuit board 1 of this exemplary embodiment, anisotropic conductive resin 4*a* applied to bumps 33 forms first resin layers 4 that are provided at the inner sides of the edges of IC chip 3 and that individually cover bumps 33. This prevents anisotropic conductive resin 4*a* from reaching the edges of IC chip 3 or the center between bumps 33. This can more securely prevent conductive particles from reaching such parts, thus more securely preventing a defective mounting of IC chip 3. Due to the above reason, the method for producing circuit board 1 of this exemplary embodiment is suitably used to mount an electronic component such as IC chip 3 to wiring board 2 that has a thin thickness of 5 μm or more and 50 μm or less and that is easily deflected for example.

Also according to this exemplary embodiment, bumps 33 of IC chip 3 can be abutted against layer-like anisotropic conductive resin 40 to easily apply anisotropic conductive resin 4*a* to protruded sections 331 of bumps 33, thus realizing an improved productivity of circuit board 1. Furthermore, bumps 33 of IC chip 3 formed as stud bumps having protruded sections 331 at the tip ends thereof can use the bumpy shape of the tip ends of bumps 33 to securely apply and retain anisotropic conductive resin 4*a* only in an amount required to seal bumps 33.

Also according to this exemplary embodiment, second resin layer 5 can stably fix IC chip 3 to wiring board 2 and can seal the space between chip body 31 and wiring board 2 to more securely prevent a defective mounting of IC chip 3, thus providing higher reliability to circuit board 1.

The circuit board of this exemplary embodiment is particularly advantageous in that chip body 31 of IC chip 3 does not require a continuity-preventing processing by the formation of an insulating film for example, thus preventing the communication characteristic of the IC card from being influenced by such a processing. Therefore, the circuit board of this exemplary embodiment is particularly suitable for a circuit board such as an inlet of an IC tag using a wiring board including an antenna for example.

As described above, the exemplary embodiment of the present invention has been described. However, the present invention is not limited to the above exemplary embodiment and various changes as shown below are possible.

Specifically, although the above exemplary embodiment has described an example in which bumps 33 of IC chip 3 are abutted against layer-like anisotropic conductive resin 40 to apply anisotropic conductive resin 4*a* to protruded sections 331 at the tip ends thereof, the present invention is not limited to this. For example, a dispenser or the like also may be used to sequentially apply anisotropic conductive resin 4*a* to the tip ends of bumps 33.

Although the above exemplary embodiment has described an example to apply adhesive agent 5*a* to a part other than electrode 23 of wiring board 2, the present invention is not limited to this. For example, adhesive agent 5*a* also may be applied to surround a plurality of regions to be joined with bumps 33 among regions of upper surface 21 of wiring board 2 on which IC chip 3 is to be mounted. In this case, adhesive agent 5*a* is preferably not formed at a part of the entire periphery in order to realize ventilation.

Although the above exemplary embodiment has described an example of an inlet of an IC card, the present invention is not limited to this. For example, the present invention also can be used to produce an inlet of an IC tag for example and also can be used to mount a driver IC for a display for example based on the chip-on-film (COF) method.

Although the above exemplary embodiment has described IC chip 3 such as a storage element as electronic component 3 mounted to wiring board 2;

the present invention is not limited to this. For example, electronic component 3 mounted to wiring board 2 also may be a mold-type IC chip having bumps as in the chip size package (CSP) or a passive chip component. Alternatively, a plurality of electronic components also may be mounted.

Although the above embodiment has described an example of wiring board 2 made of PET, the present invention is not limited to this. For example, wiring board 2 also may be a flexible board made of polyether ether ketone (PEEK) or polyimide for example.

Industrial Applicability

The present invention can be used for a circuit board used as IC card or an inlet of an IC tag or various other circuit boards.

The invention claimed is:

1. A circuit board comprising:
a flexible wiring board;
an electronic component mounted on a main surface of the wiring board via a plurality of bumps;
first resin layers that are made of anisotropic conductive resin including conductive particles and that individually cover the plurality of bumps; and
a second resin layer that fixes the electronic component and the wiring board,
wherein the wiring board between the plurality of bumps is deformed and brought closer to the electronic component.

2. The circuit board according to claim 1, wherein,
the first resin layers are provided at inner sides of edges of the electronic component.

3. The circuit board according to claim 1, wherein,
the electronic component is a storage element that stores predetermined information; and
the wiring board includes a wireless communication antenna that is electrically connected to the electronic component and that is used to read the predetermined information stored in the electronic component.

4. The circuit board according to claim 1, wherein all of the wiring board except for the portions of the wiring board in contact with the plurality of bumps is deformed and brought closer to the electronic component.

5. The circuit board according to claim 1, wherein the plurality of bumps are three bumps, one of which is a dummy bump.

6. The circuit board according to claim 1, wherein a concave-convex profile is formed on the leading end of the plurality of bumps.

7. The circuit board according to claim 1, wherein the flexible wiring board is a wiring board having a thickness of 5µm or more and 50µm or less, being made of any one of polyethylene terephthalate, polyether ether ketone, and polyimide.

* * * * *